(12) United States Patent
Taghivand

(10) Patent No.: US 8,736,392 B2
(45) Date of Patent: May 27, 2014

(54) TRANSFORMER-BASED CMOS OSCILLATORS

(75) Inventor: Mazhareddin Taghivand, Campbell, CA (US)

(73) Assignee: QUALCOMM Incorporated, San Diego, CA (US)

( * ) Notice: Subject to any disclaimer, the term of this patent is extended or adjusted under 35 U.S.C. 154(b) by 339 days.

(21) Appl. No.: 12/406,525

(22) Filed: Mar. 18, 2009

(65) Prior Publication Data
US 2010/0238843 A1    Sep. 23, 2010

(51) Int. Cl.
  *H03B 5/08*    (2006.01)
  *H03B 5/18*    (2006.01)

(52) U.S. Cl.
  USPC ............... 331/167; 331/117 R; 331/117 FE; 331/36 L; 370/277

(58) Field of Classification Search
  USPC .............. 331/36 L, 114, 117 FE, 117 R, 167; 370/277
  See application file for complete search history.

(56) References Cited

U.S. PATENT DOCUMENTS

| | | | |
|---|---|---|---|
| 3,614,664 A * | 10/1971 | Shute | 331/90 |
| 4,229,668 A | 10/1980 | Ebihara et al. | |
| 4,818,953 A * | 4/1989 | Feldstein | 331/114 |
| 6,201,287 B1 * | 3/2001 | Forbes | 257/528 |
| 6,356,602 B1 | 3/2002 | Rodal et al. | |
| 6,606,008 B2 * | 8/2003 | Traub | 331/117 R |
| 6,867,656 B2 | 3/2005 | Hajimiri et al. | |
| 7,027,793 B2 | 4/2006 | Gard et al. | |
| 7,107,035 B2 | 9/2006 | Otaka | |
| 7,116,183 B2 * | 10/2006 | Wu | 331/176 |
| 7,154,349 B2 | 12/2006 | Cabanillas | |
| 7,245,190 B2 | 7/2007 | Copani et al. | |
| 7,250,826 B2 | 7/2007 | Gabara | |
| 7,336,134 B1 * | 2/2008 | Janesch et al. | 331/36 C |
| 7,362,192 B1 * | 4/2008 | Lin et al. | 331/117 FE |
| 7,423,495 B2 | 9/2008 | Bevilacqua et al. | |
| 7,446,617 B2 | 11/2008 | Jang et al. | |

(Continued)

FOREIGN PATENT DOCUMENTS

| | | |
|---|---|---|
| JP | 54009544 A | 1/1979 |
| JP | 2000068744 A | 3/2000 |

(Continued)

OTHER PUBLICATIONS

Li, et al., "A 21 GHz Complementary Transformer Coupled CMOS VCO," IEEE Microwave and Wireless Components Letters, vol. 18, No. 4, Apr. 2008.

(Continued)

*Primary Examiner* — Arnold Kinkead
*Assistant Examiner* — Richard Tan
(74) *Attorney, Agent, or Firm* — Kevin T. Cheatham

(57) ABSTRACT

Techniques for providing transformer-based CMOS oscillators capable of operation with low voltage power supplies. In an exemplary embodiment, an LC tank is provided at the drains of a transistor pair, and the inductance of the LC tank is mutually magnetically coupled to an inductance between the gates of the transistor pair. A separate complementary transistor pair is also coupled to the LC tank. A further exemplary embodiment provides an LC tank at the gates of a transistor pair, as well as for three-way coupling amongst a tank inductance, an inductance between the gates of the transistor pair, and an inductance between the gates of a complementary transistor pair.

12 Claims, 11 Drawing Sheets

(56) References Cited

U.S. PATENT DOCUMENTS

| | | | |
|---|---|---|---|
| 7,710,211 B2 * | 5/2010 | Jang et al. | 331/167 |
| 7,724,102 B2 * | 5/2010 | Ullmann | 331/117 R |
| 7,764,127 B2 | 7/2010 | Sun et al. | |
| 8,031,019 B2 | 10/2011 | Chawla et al. | |
| 2004/0203479 A1 * | 10/2004 | Lin | 455/73 |
| 2004/0222861 A1 * | 11/2004 | Mondal et al. | 331/117 R |
| 2005/0046499 A1 | 3/2005 | Luong et al. | |
| 2005/0219005 A1 * | 10/2005 | Waible | 331/167 |
| 2006/0097801 A1 | 5/2006 | Adan | |
| 2006/0181362 A1 | 8/2006 | Ikuta et al. | |
| 2006/0261902 A1 | 11/2006 | Masuda et al. | |
| 2007/0057740 A1 | 3/2007 | Ryu et al. | |
| 2007/0146088 A1 * | 6/2007 | Arai et al. | 331/167 |
| 2007/0188255 A1 | 8/2007 | Strandberg | |
| 2008/0048788 A1 * | 2/2008 | Yu | 331/16 |
| 2008/0111644 A1 * | 5/2008 | Jang et al. | 331/167 |
| 2008/0129392 A1 | 6/2008 | Lee et al. | |
| 2008/0164954 A1 | 7/2008 | Kim | |
| 2008/0174378 A1 * | 7/2008 | Cusmai et al. | 331/167 |
| 2008/0197894 A1 | 8/2008 | Jang et al. | |
| 2008/0272851 A1 * | 11/2008 | Lin et al. | 331/115 |
| 2009/0002079 A1 * | 1/2009 | Venuti et al. | 331/10 |
| 2009/0184774 A1 | 7/2009 | Deng et al. | |
| 2009/0251207 A1 * | 10/2009 | Plevridis et al. | 329/307 |

FOREIGN PATENT DOCUMENTS

| | | |
|---|---|---|
| JP | 2002529949 A | 9/2002 |
| JP | 2006080990 A | 3/2006 |
| JP | 2006121435 A | 5/2006 |
| JP | 2006324953 A | 11/2006 |
| JP | 2007174552 A | 7/2007 |
| JP | 2008172791 A | 7/2008 |
| TW | 200711289 A | 3/2007 |
| TW | 200807902 A | 2/2008 |
| TW | 200906055 A | 2/2009 |
| WO | 0027026 A2 | 5/2000 |

OTHER PUBLICATIONS

Lee, et al., "A Transformer-based Low Phase Noise and Widely Tuned CMOS Quadrature VCO," Circuits and Systems 2006, IEEE ISCAS 2006.

Lee, et al., "Q-Enhanced 5 GHz CMOS VCO Using 4-port Transformer," Silicon Monolithic Integrated Circuits in RF Systems, 2007 Topical Meeting on (Jan. 2007).

Kyung-Gyu Park, et al., "Current Reusing VCO and Divide-by-Two Frequency Divider for Quadrature LO Generation," IEEE Microwave and Wireless Components Letters, pp. 413-415, Jun. 2008.

To-Po Wang, et al., "A Low-Power Oscillator Mixer in 0.18-μm CMOS Technology", IEEE Transactions on Microwave Theory and Techniques, pp. 88-95, Jan. 2006.

International Search Report and Written Opinion—PCT/US2010/027861—International Search Authority—European Patent Office—May 19, 2010.

Leung, Lincoln L. K. et al: "A 1-V, 9.7mW CMOS Frequency Synthesizer for WLAN 802.11a Transceivers," 2005 Symposium on VLSI Circuits Digest of Technical Papers. Piscataway, NJ, USA, (Jun. 16, 2005), pp. 252-255, XP010818423, DOI:10.1109/VLSIC.2005.1469379, ISBN: 978-4-900784-01-7.

Park, Dongmin et al.: "A 1.8 V 900 W 4.5 GHz VCO and Prescaler in 0.18 m CMOS Using Charge-Recycling Technique," IEEE Microwave and Wireless Components Letters, vol. 19 (2), pp. 104-106, Feb. 1, 2009.

Taiwan Search Report—TW099108078—TIPO—Jan. 16, 2013.

* cited by examiner

TRANSFORMER-BASED CMOS OSCILLATORS

RELATED PATENT APPLICATION

This application is related to U.S. patent application Ser. No. 12/363,911, entitled, "Integrated Voltage-Controlled Oscillator Circuits," filed Feb. 2, 2009, assigned to the assignee of the present application, the contents of which are hereby incorporated by reference in their entirety.

TECHNICAL FIELD

The disclosure relates to integrated circuit design, and more particularly, to the design of transformer-based CMOS oscillators having controllable oscillation frequencies.

BACKGROUND

Voltage-controlled oscillators (VCO's) and digitally-controlled oscillators (DCO's) are used to generate a signal having an oscillation frequency determined by a control signal. In a VCO, a fine tuning component of the control signal is specified using an analog control voltage, while in a DCO, the fine tuning component of the control signal is specified using a digital control signal. To save power in electronics devices such as portable communications devices, VCO's and DCO's are increasingly designed to work with power supplies having lower voltage levels.

In one prior art oscillator circuit design, an LC tank having a variable capacitance is coupled to at least one cross-coupled transistor pair. The cross-coupled transistor pair functions as a negative resistance, causing the voltage across the LC tank to oscillate at the tank resonant frequency. In prior art oscillator designs, the transistor drains may be directly DC cross-coupled to the transistor gates. This DC cross-coupling reduces the voltage headroom available from a low voltage power supply, since the drain-source voltage is made equal to the gate-source turn-on voltage of the transistors. In a CMOS cross-coupled pair oscillator design, wherein both an NMOS and a PMOS cross-coupled pair are provided, the voltage supply must support both the NMOS gate-source turn-on voltage and the PMOS gate-source turn-on voltage.

It would be desirable to provide techniques for oscillator design that more efficiently utilize the voltage headroom available from a low voltage power supply, while adequately meeting other oscillator design criteria such as low phase noise.

SUMMARY

An aspect of the present disclosure provides an apparatus for generating a signal having a controlled oscillation frequency at a pair of output nodes, the apparatus comprising: a first transistor and a second transistor, the drains of the first and second transistors coupled to the pair of output nodes; a first inductor coupled to the gates of the first and second transistors; a second inductor coupled to the pair of output nodes, the second inductor being magnetically coupled to the first inductor; a capacitor having a selectable capacitance coupled to the pair of output nodes; and a DC cross-coupled complementary transistor pair coupled to the pair of output nodes.

Another aspect of the present disclosure provides an apparatus for generating a signal having a controlled oscillation frequency at a pair of output nodes, the apparatus comprising: a first transistor and a second transistor, the drains of the first and second transistors coupled to the pair of output nodes; a first inductor coupled to the gates of the first and second transistors; a second inductor coupled to the pair of output nodes, the second inductor being magnetically coupled to the first inductor; a capacitor having a selectable capacitance coupled to the pair of output nodes; and a first complementary transistor and a second complementary transistor, the drains of the first and second complementary transistors coupled to the pair of output nodes, the gate of the first complementary transistor AC-coupled to the drain of the second complementary transistor via a second AC-coupling capacitor, the gate of the second complementary transistor AC-coupled to the drain of the first complementary transistor via a first AC-coupling capacitor.

Yet another aspect of the present disclosure provides an apparatus for generating a signal having a controlled oscillation frequency at a pair of output nodes, the apparatus comprising: a first transistor and a second transistor, the drains of the first and second transistors coupled to the pair of output nodes; a first inductor coupled to the gates of the first and second transistors; a second inductor coupled to the pair of output nodes, the second inductor being magnetically coupled to the first inductor; a first complementary transistor and a second complementary transistor, the drains of the first and second complementary transistors coupled to the pair of output nodes; and a third inductor coupled to the gates of the first and second complementary transistors, the third inductor being magnetically coupled to the second inductor.

Yet another aspect of the present disclosure provides a method for generating a signal having a controlled oscillation frequency at a pair of output nodes in an oscillator, the oscillator comprising a first transistor and a second transistor, the drains of the first and second transistors coupled to the pair of output nodes; the oscillator further comprising a first inductor coupled to the gates of the first and second transistors; the oscillator further comprising a second inductor coupled to the pair of output nodes; the oscillator further comprising a capacitor having a selectable capacitance coupled to the pair of output nodes; the method comprising: magnetically coupling the second inductor to the first inductor; coupling the signals at the gates of the first and second transistors via the first inductor to a bias; and coupling the signals at the drains of a cross-coupled complementary transistor pair to the pair of output nodes.

Yet another aspect of the present disclosure provides a method for generating a signal having a controlled oscillation frequency at a pair of output nodes in an oscillator, the oscillator comprising a first transistor and a second transistor, the drains of the first and second transistors coupled to the pair of output nodes; the oscillator further comprising a first inductor coupled to the gates of the first and second transistors; the oscillator further comprising a second inductor coupled to the pair of output nodes; the oscillator further comprising a capacitor having a selectable capacitance coupled to the pair of output nodes; the method comprising: magnetically coupling the second inductor to the first inductor; coupling the signals at the gates of the first and second transistors via the first inductor to a bias; coupling the signals at the gates of a complementary transistor pair via AC coupling capacitors to the pair of output nodes; coupling the signals at the drains of the complementary transistor pair to the pair of output nodes, the drain of each of the complementary transistor coupled to the gate of the other complementary transistor via one of the AC coupling capacitors; and coupling the signals at the gates of the complementary transistor pair to a bias.

Yet another aspect of the present disclosure provides a method for generating a signal having a controlled oscillation frequency at a pair of output nodes in an oscillator, the oscillator comprising a first transistor and a second transistor, the drains of the first and second transistors coupled to the pair of output nodes; the oscillator further comprising a first inductor coupled to the gates of the first and second transistors; the oscillator further comprising a second inductor coupled to the pair of output nodes; the oscillator further comprising a first complementary transistor and a second complementary transistor, the drains of the first and second complementary transistors coupled to the pair of output nodes; the oscillator further comprising a third inductor coupled to the gates of the complementary transistors; the method comprising: magnetically coupling the second inductor to the first inductor; magnetically coupling the third inductor to the second inductor; coupling the gates of the first and second transistors via the first inductor to a bias; and coupling the signals at the gates of the first and second complementary transistors via the third inductor to a bias.

Yet another aspect of the present disclosure provides a method for generating a signal having a controlled oscillation frequency at a pair of output nodes in an oscillator, the oscillator comprising a first transistor and a second transistor, the drains of the first and second transistors coupled to the pair of output nodes; the oscillator further comprising a first inductor coupled to the gates of the first and second transistors; the oscillator further comprising a second inductor coupled to the pair of output nodes; the method comprising: magnetically coupling the second inductor to the first inductor; and controlling the oscillation frequency by configuring a selectable bank of capacitors coupled to the gates of the first and second transistors.

Yet another aspect of the present disclosure provides an apparatus for generating a signal having a controlled oscillation frequency at a pair of output nodes, the apparatus comprising: a first transistor and a second transistor, the drains of the first and second transistors coupled to the pair of output nodes; a first inductor coupled to the gates of the first and second transistors; a second inductor coupled to the pair of output nodes, the second inductor being magnetically coupled to the first inductor; means for generating a negative resistance coupled to the pair of output nodes, the means comprising first and second complementary transistors; and means for selecting the oscillation frequency.

Yet another aspect of the present disclosure provides a device for wireless communications, the device comprising a TX LO signal generator, at least one baseband TX amplifier, an upconverter coupled to the TX LO signal generator and the at least one baseband TX amplifier, a TX filter coupled to the output of the upconverter, a power amplifier (PA) coupled to the TX filter, an RX LO signal generator, an RX filter, a downconverter coupled to the RX LO signal generator and the RX filter, a low-noise amplifier (LNA) coupled to the RX filter, and a duplexer coupled to the PA and the LNA, at least one of the TX LO and RX LO signal generator comprising an oscillator having a pair of output nodes coupled to a mixer, the oscillator comprising: a first transistor and a second transistor, the drains of the first and second transistors coupled to the pair of output nodes; a first inductor coupled to the gates of the first and second transistors; a second inductor coupled to the pair of output nodes, the second inductor being magnetically coupled to the first inductor; a capacitor having a selectable capacitance coupled to the pair of output nodes; and a cross-coupled complementary transistor pair coupled to the pair of output nodes.

Yet another aspect of the present disclosure provides a device for wireless communications, the device comprising a TX LO signal generator, at least one baseband TX amplifier, an upconverter coupled to the TX LO signal generator and the at least one baseband TX amplifier, a TX filter coupled to the output of the upconverter, a power amplifier (PA) coupled to the TX filter, an RX LO signal generator, an RX filter, a downconverter coupled to the RX LO signal generator and the RX filter, a low-noise amplifier (LNA) coupled to the RX filter, and a duplexer coupled to the PA and the LNA, at least one of the TX LO and RX LO signal generator comprising an oscillator having a pair of output nodes coupled to a mixer, the oscillator comprising: a first transistor and a second transistor, the drains of the first and second transistors coupled to the pair of output nodes; a first inductor coupled to the gates of the first and second transistors; a second inductor coupled to the pair of output nodes, the second inductor being magnetically coupled to the first inductor; a first complementary transistor and a second complementary transistor, the drains of the first and second complementary transistors coupled to the pair of output nodes; and a third inductor coupled to the gates of the first and second complementary transistors, the third inductor being magnetically coupled to the second inductor.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
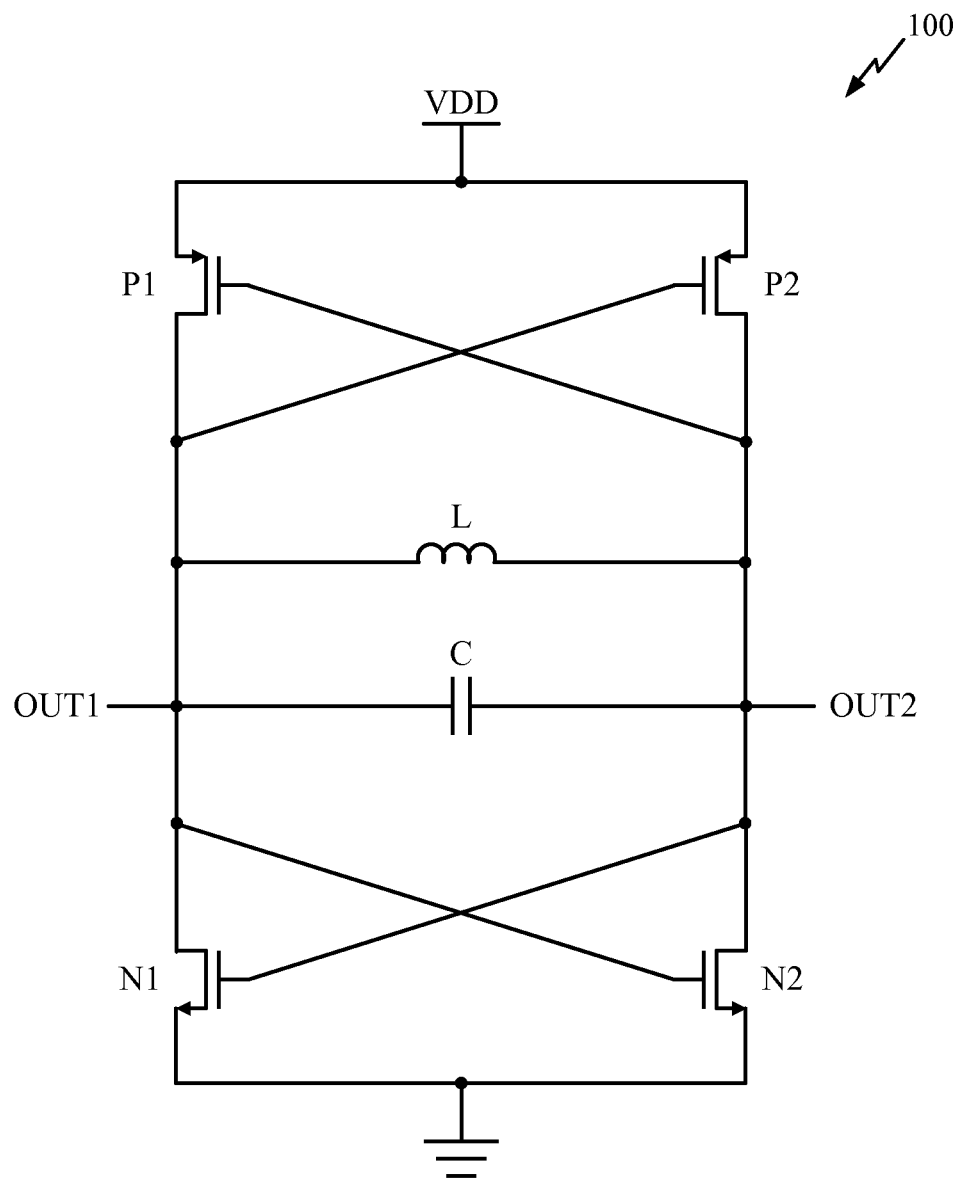
FIG. 1 illustrates a prior art implementation of a CMOS cross-coupled VCO.

FIG. 1 illustrates a prior art implementation of a CMOS cross-coupled pair VCO 100. In FIG. 1, inductance L and capacitance C form an LC tank, whose end terminals OUT1, OUT2 form a pair of output nodes coupled to a DC cross-coupled NMOS pair N1, N2 and a DC cross-coupled PMOS pair P1, P2. One of ordinary skill in the art will appreciate that the cross-coupled NMOS and PMOS pairs function as negative resistances, causing the voltage across the LC tank to oscillate at the tank resonant frequency.

In a VCO implementation, to control the tank resonant frequency, the capacitance C may include a switchable capacitor bank (not shown) for coarse frequency tuning and/or a varactor (not shown) for fine frequency tuning. In a DCO implementation, the fine frequency tuning may be accomplished by selectively enabling a plurality of digitally selectable capacitors (not shown) making up C.

One disadvantage of the prior art CMOS VCO 100 is the relatively large voltage headroom required by the DC cross-coupled transistor pairs N1, N2 and P1, P2. In particular, the PMOS transistors P1, P2 require a minimum gate turn-on voltage Von_P during operation, while the NMOS transistors N1, N2 similarly require a minimum gate turn-on voltage Von_N. As the gate of each transistor is DC cross-coupled to the drain of the other transistor of the pair, the DC bias voltages for the transistors consume a total of Von_P+Von_N of the total headroom available from the voltage supply VDD. When a low voltage supply VDD is used, this may leave insufficient voltage margin for the start-up gain that is typically required to initiate oscillation in the circuit.

Figure 2:
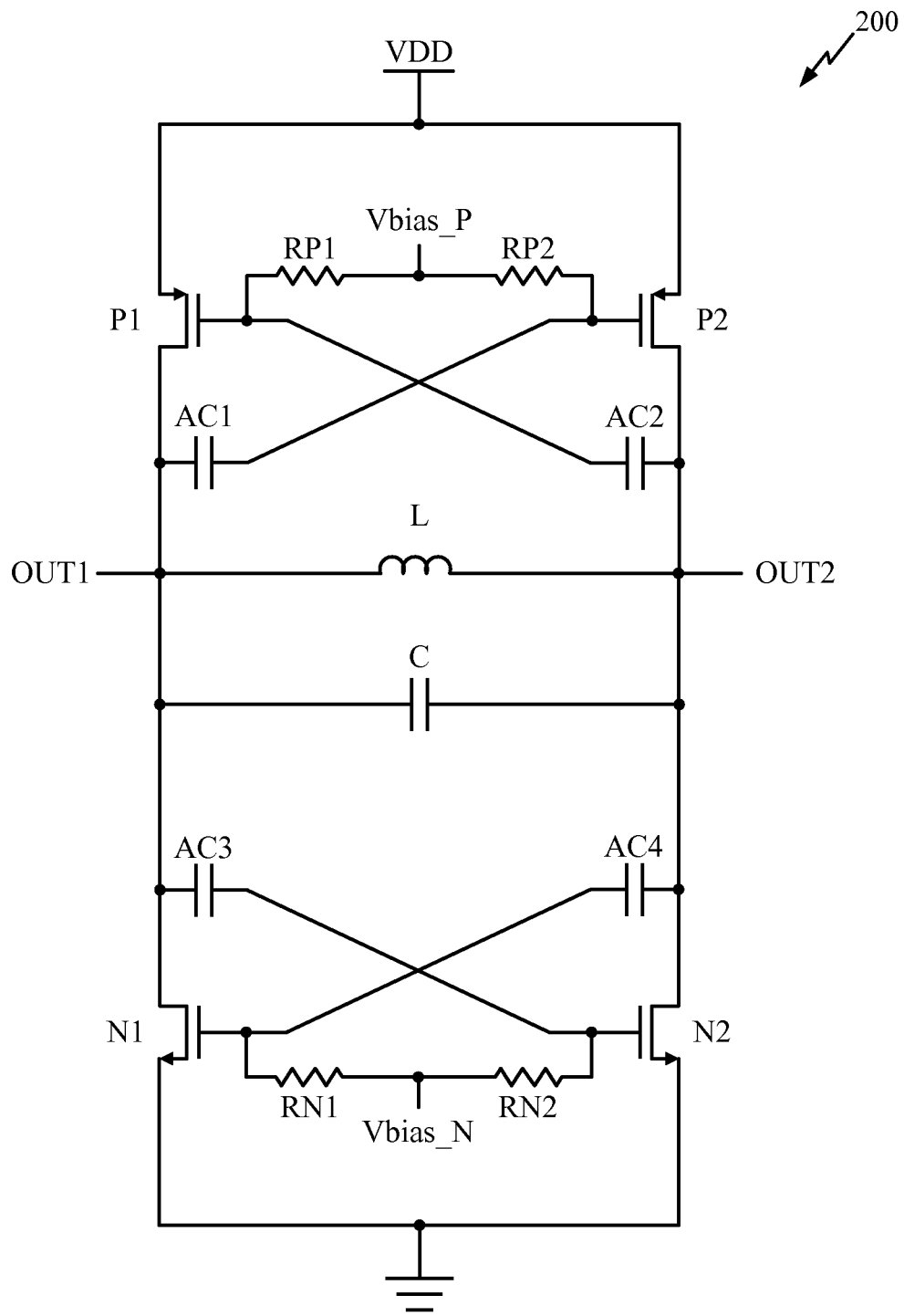
FIG. 2 illustrates another prior art CMOS VCO.

FIG. 2 illustrates another prior art CMOS VCO 200. In FIG. 2, the gates of transistors P1, P2 are separately DC biased by the voltage Vbias_P using resistors RP1, RP2, respectively, while transistors N1, N2 are separately DC biased by the voltage Vbias_N using resistors RN1, RN2, respectively. In addition, the gates of the transistors P1, P2, N1, N2 are capacitively cross-coupled to the drain of the other transistor of the pair, using AC coupling capacitors AC2, AC1, AC4, AC3, respectively. Because the drain of each transistor is DC-decoupled from the gate of the other transistor of the pair, it is possible to bias the gate-source voltage of each transistor independently of its drain-source voltage.

Figure 3:
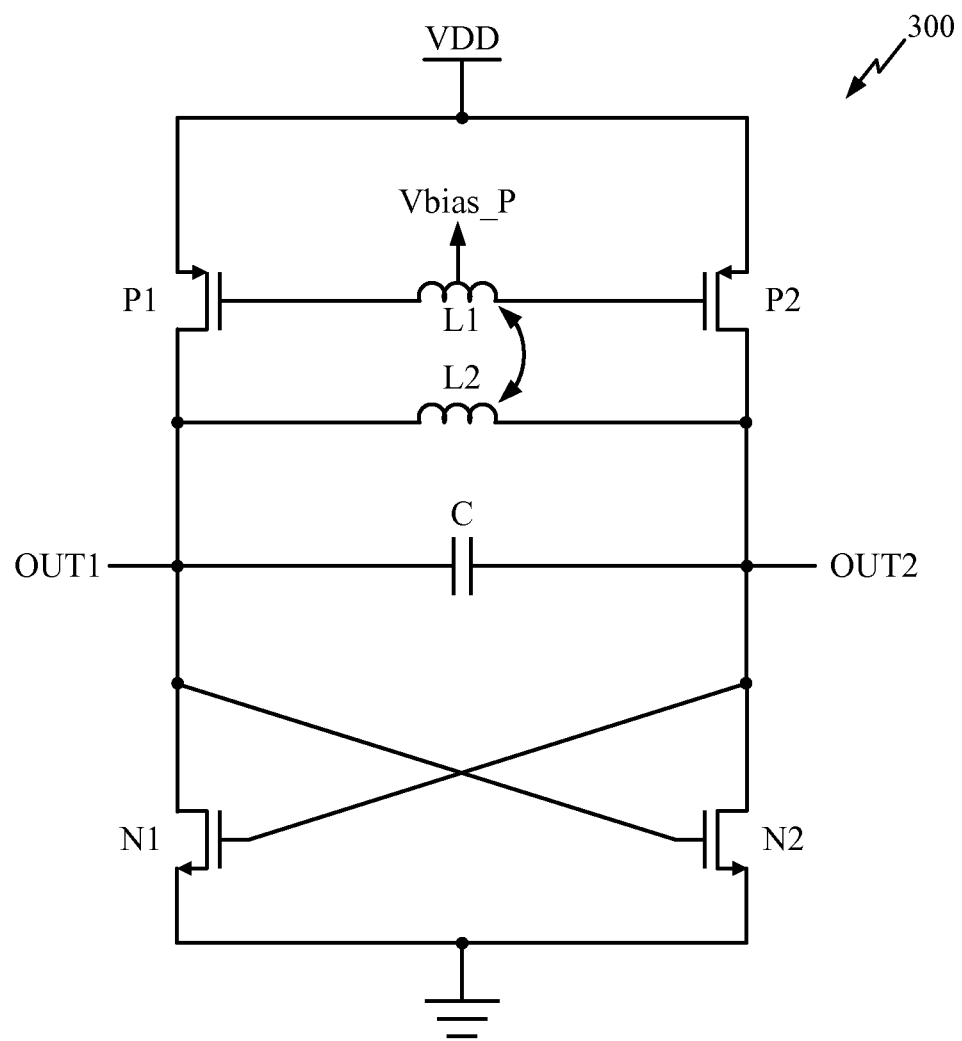
FIG. 3 illustrates an exemplary embodiment of a CMOS VCO according to the present disclosure.

FIG. 3 illustrates an exemplary embodiment of a CMOS VCO 300 according to the present disclosure. In FIG. 3, two inductors L1, L2 are provided, with L1 being coupled to the gates of P1, P2, while L2 is provided as the tank inductance. In the exemplary embodiment shown, L1 and L2 are mutually magnetically coupled, i.e., inductances L1, L2 collectively form a transformer. Note the bi-directional arrow shown between inductors L1 and L2, and elsewhere in the figures, is meant to illustrate mutual magnetic coupling between the elements pointed to. The mutual coupling between L1 and L2 allows the signal voltages at output nodes OUT2, OUT1 to be coupled to the gates of P1, P2, respectively. To DC bias P1, P2, the inductor L1 is tapped, e.g., center-tapped, by the bias voltage Vbias_P. A DC cross-coupled NMOS pair N1, N2 is further coupled to the output.

One of ordinary skill in the art will appreciate that due to the mutual magnetic coupling between inductors L1 and L2, a negative resistance is effectively created without a DC or capacitive cross-coupling connection between the drains and gates of P1, P2.

In an exemplary embodiment, the appropriate coupling coefficient between L1 and L2 may be a design parameter chosen based on, e.g., the semiconductor process technology used. Typical values may be, e.g., 0.5, 0.3, or 0.2. Note these values are given for illustrative purposes only, and are not meant to restrict the scope of the present disclosure to any particular values explicitly given.

In an exemplary embodiment wherein a frequency of operation is around 5 GHz, L2 may have an inductance of 0.45 nH, while L1 may have an inductance of 1.5 nH.

In an exemplary embodiment, L2, or the tank inductance, may have a relatively high Q (i.e., quality factor), while L1 may have a lower Q than L2.

One of ordinary skill in the art will appreciate that various technologies exist for implementing transformers in integrated circuit processes, e.g., interwinding inductors, stacking inductors, etc. Any such technologies are contemplated to be within the scope of the present disclosure.

One of ordinary skill in the art will further appreciate that the inductor L1 may be implemented as a single inductor as shown, or it may be implemented as two or more series-coupled constituent inductors. Such alternative exemplary embodiments are contemplated to be within the scope of the present disclosure.

Note while exemplary embodiments are described with reference to VCO's herein, the techniques of the present disclosure may be readily applied to the design of DCO's as well. Such alternative exemplary embodiments are contemplated to be within the scope of the present disclosure.

Figure 7:
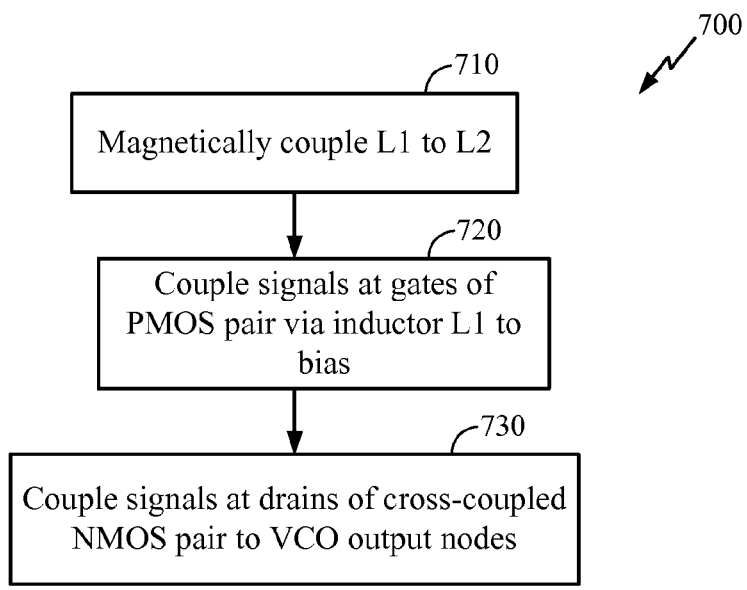
FIG. 7 illustrates an exemplary embodiment of a method utilizing a CMOS VCO such as the one shown in FIG. 3.

FIG. 7 illustrates an exemplary embodiment of a method 700 utilizing a CMOS VCO such as the VCO 300 in FIG. 3. Note the methods described herein are shown for illustrative purposes only, and are not meant to limit the scope of the present disclosure to any particular methods disclosed.

At step 710, L1 is magnetically coupled to L2.

At step 720, the signals at the gates of the PMOS pair are coupled via inductor L1 to a bias voltage.

At step 730, the signals at the drains of the cross-coupled NMOS pair are coupled to the VCO output nodes OUT1, OUT2.

Note while certain exemplary embodiments described herein may show a DC or capacitively cross-coupled NMOS pair with a PMOS inductor-coupled pair, one of ordinary skill in the art may readily derive alternative exemplary embodiments (not shown) having a DC or capacitively cross-coupled PMOS pair with an NMOS inductor-coupled pair. Such an alternative exemplary embodiment is contemplated to be within the scope of the present disclosure.

Further note that in this specification and in the claims, the term "complementary" may be used to denote the relationship between a PMOS transistor and an NMOS transistor. For example, the complementary transistor pair to an NMOS pair may be a PMOS pair, and vice versa.

Figure 4:
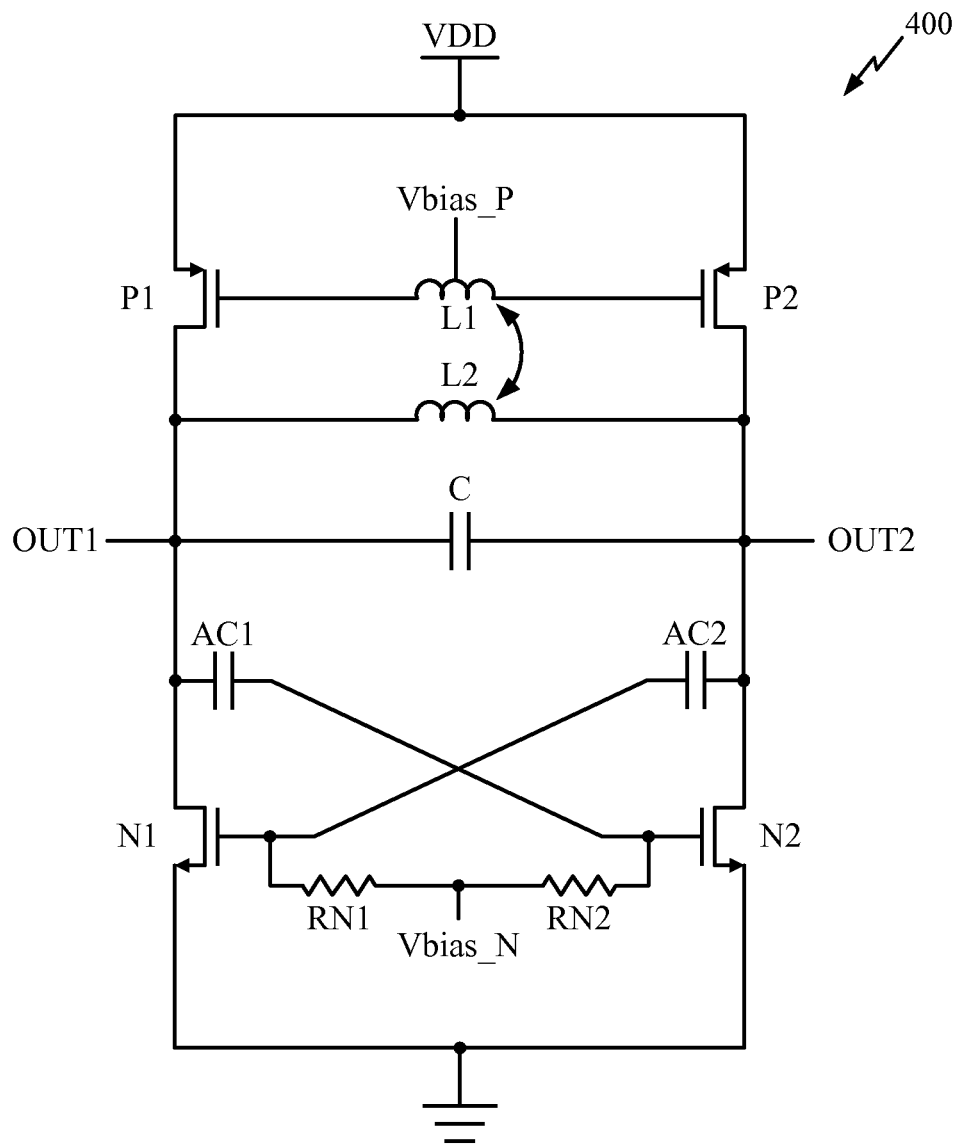
FIG. 4 illustrates an alternative exemplary embodiment of a CMOS VCO according to the present disclosure.

FIG. 4 illustrates an alternative exemplary embodiment of a CMOS VCO 400 according to the present disclosure, wherein the gates of PMOS transistors P1, P2 are coupled using an inductor L1 magnetically coupled to the tank inductance L2 as previously described, and also wherein the NMOS transistors N1, N2 are capacitively cross-coupled. The NMOS transistors N1, N2 in VCO 400 may advantageously consume less voltage headroom than a pair of DC cross-coupled NMOS transistors.

Figure 7A:
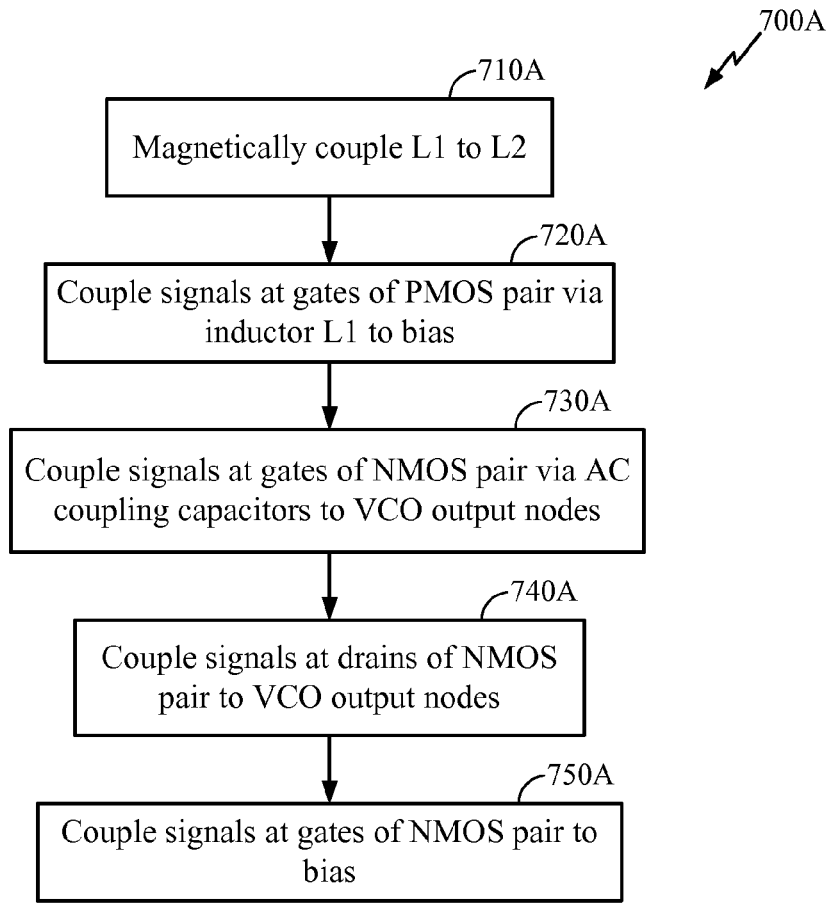
FIG. 7A illustrates an exemplary embodiment of a method utilizing a CMOS VCO such as the such as the one shown in FIG. 4.

FIG. 7A illustrates an exemplary embodiment of a method 700A utilizing a CMOS VCO such as the VCO 400 in FIG. 4.

At step 710A, L1 is magnetically coupled to L2.

At step 720A, the signals at the gates of the PMOS pair are coupled via inductor L1 to a bias.

At step 730A, the signals at the gates of the NMOS pair are coupled via AC coupling capacitors to VCO output nodes OUT2, OUT1.

At step 740A, the signals at the drains of the NMOS pair are coupled to the VCO output nodes OUT1, OUT2.

At step 750A, the signals at the gates of the NMOS pair are coupled to the bias.

Figure 5:
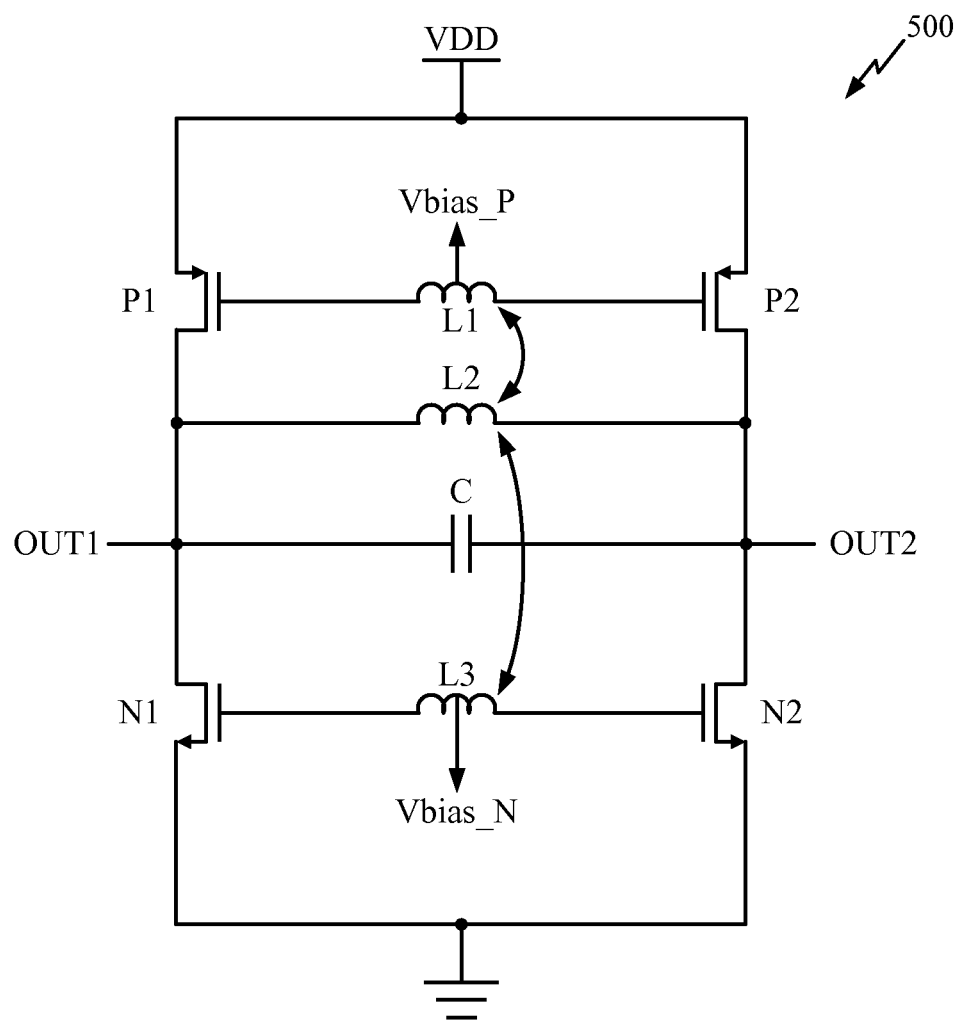
FIG. 5 illustrates an alternative exemplary embodiment of a CMOS VCO according to the present disclosure, wherein three mutually coupled inductors are provided.

FIG. 5 illustrates an alternative exemplary embodiment of a CMOS VCO 500 according to the present disclosure. In the VCO 500, a transformer with three mutually magnetically coupled inductors L1, L2, L3 is provided. One of ordinary skill in the art will appreciate that such transformers may be directly implemented using CMOS technology, a combination of CMOS technology and package metal layers, or package metal layers exclusively. Inductors L1, L2 function in the same manner as described for L1, L2 in the VCO 400. Inductor L3, which is mutually magnetically coupled to inductors L1, L2, couples the voltages at output nodes OUT2, OUT1 to the gates of N1, N2, respectively. To bias transistors N1, N2, the inductor L3 is tapped, e.g., center-tapped, by the bias voltage Vbias_N.

Figure 7B:
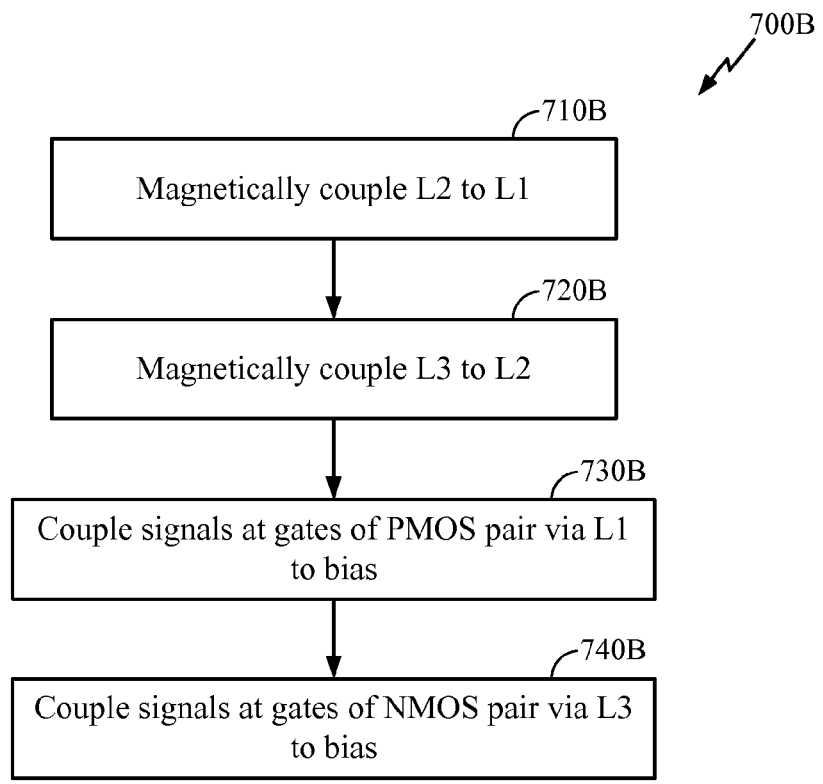
FIG. 7B illustrates an exemplary embodiment of a method utilizing a CMOS VCO such as the one shown in FIG. 5.

FIG. 7B illustrates an exemplary embodiment of a method 700B utilizing a CMOS VCO such as the VCO 500 in FIG. 5.

At step 710B, L2 is magnetically coupled to L1.

At step 720B, L3 is magnetically coupled to L2.

At step 730B, the signals at the gates of the PMOS pair are coupled via L1 to a bias.

At step 740B, the signals at the gates of the NMOS pair are coupled via L3 to the bias.

Figure 5A:
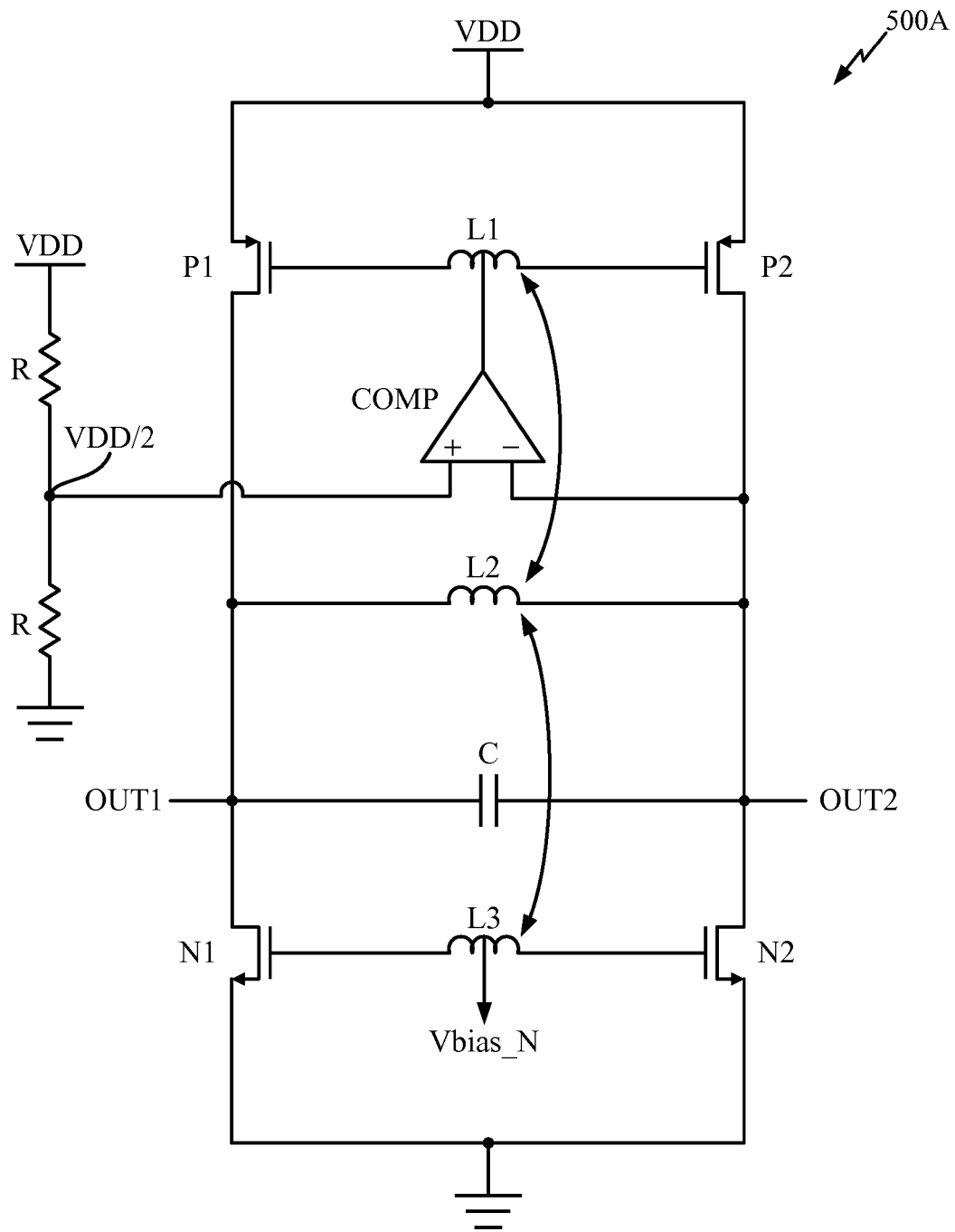
FIG. 5A illustrates an exemplary embodiment of a common-mode feedback (CMFB) biasing scheme for biasing the CMOS VCO in FIG. 5.

FIG. 5A illustrates an exemplary embodiment of a common-mode feedback (CMFB) biasing scheme for biasing transistor P1, P2 in the VCO 500. Note the biasing scheme is shown for illustrative purposes only, and is not meant to limit the scope of the present disclosure to any particular biasing scheme. In FIG. 5A, the differential amplifier COMP senses the voltage at OUT2, and adjusts the gate bias of P1, P2 to bring OUT2 close to the reference voltage VDD/2.

Figure 6:
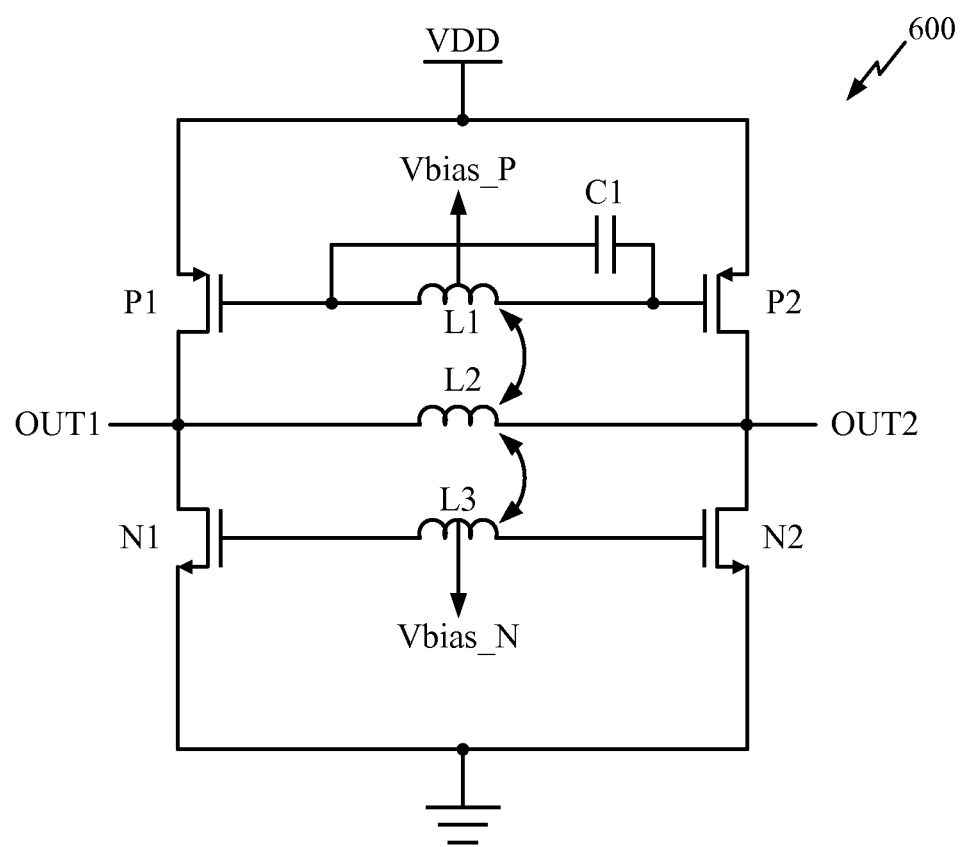
FIG. 6 illustrates an alternative exemplary embodiment of a CMOS VCO according to the present disclosure, wherein a switchable bank of capacitors is provided at the gate of a PMOS pair.

FIG. 6 illustrates an alternative exemplary embodiment of a CMOS VCO 600 according to the present disclosure, wherein a tank capacitance C1 is coupled to the gates of the PMOS transistors P1, P2, rather than to their drains.

Figure 9:
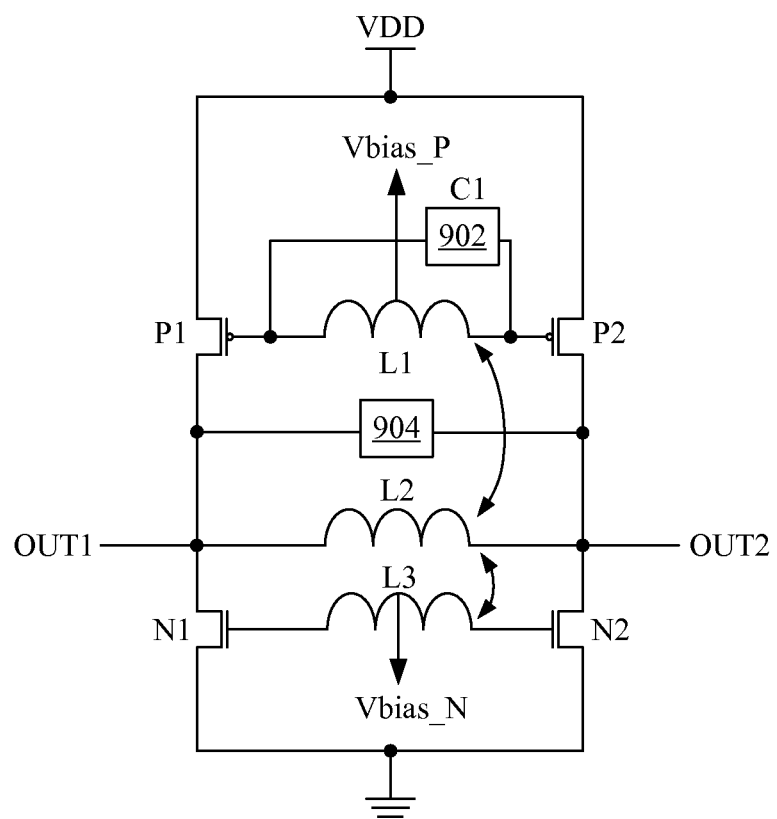
FIG. 9 illustrates an alternative exemplary embodiment of a CMOS VCO according to the present disclosure.

In an exemplary embodiment of a VCO, the capacitance C1 may include both a switchable bank of capacitors for coarse frequency tuning and an analog-voltage controlled varactor element for fine frequency tuning In an alternative exemplary embodiment depicted in FIG. 9, the capacitance C1 may include only the switchable bank of capacitors 902 for coarse tuning, while a separate varactor element 904 for fine tuning may be coupled to the drains of the PMOS transistors P1, P2.

In a further alternative exemplary embodiment of a DCO (not shown), a varactor element may readily be replaced by a plurality of switchable capacitors. Such alternative exemplary embodiments are contemplated to be within the scope of the present disclosure.

In an exemplary embodiment of VCO 600, the quality factor Q of the inductor L1 may be made higher than the Q of the inductor L2. For example, the Q of L2 may be 4 or 5, while the Q of L1 may range from 15 to 25. Note the exemplary Q values are given for illustration only, and are not meant to limit the scope of the present disclosure.

Figure 7C:
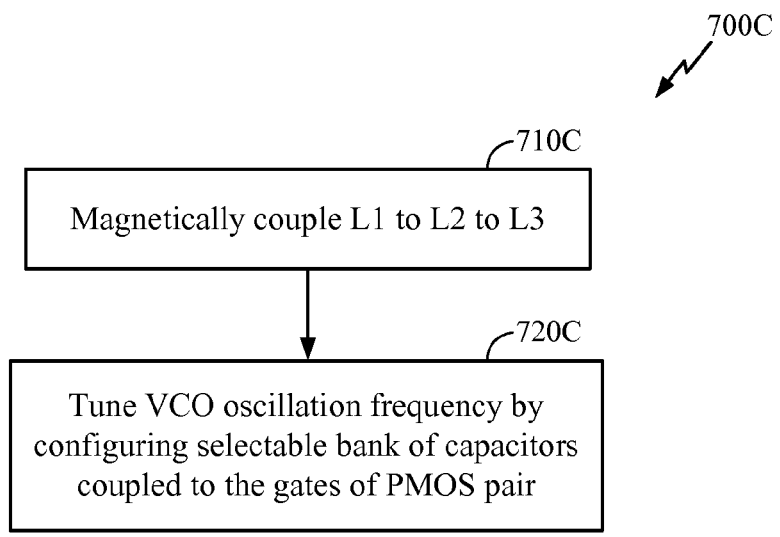
FIG. 7C illustrates an exemplary embodiment of a method utilizing a CMOS VCO such as the one shown in FIG. 6.

FIG. 7C illustrates an exemplary embodiment of a method 700C utilizing a CMOS VCO such as the VCO 600 in FIG. 6.

At step 710C, L1 is magnetically coupled to L2, which is magnetically coupled to L3.

At step 720C, the VCO oscillation frequency is tuned by configuring a selectable bank of capacitors coupled to the gates of the PMOS pair.

One of ordinary skill in the art will appreciate that all techniques described herein for configuring a PMOS transistor pair are equally applicable to configuring an NMOS transistor pair. For example, in light of the topology of the VCO 300 disclosed in FIG. 3, one of ordinary skill in the art may readily derive a VCO topology (not shown) wherein a cross-coupled PMOS pair is provided, and a tank inductance is magnetically coupled to an inductance connecting the gate of a first NMOS transistor with the gate of a second NMOS transistor. The same applies to the circuit topologies disclosed in FIGS. 4, 5, and 6. Such alternative exemplary embodiments are contemplated to be within the scope of the present disclosure.

One of ordinary skill in the art will appreciate that while exemplary embodiments of the present disclosure have been described with reference to MOS transistors (i.e., MOSFET's), the techniques of the present disclosure need not be limited to MOSFET-based designs, and may be readily applied to alternative exemplary embodiments (not shown) employing bipolar junction transistors (or BJT's) and/or other three-terminal transconductance devices. For example, in an exemplary embodiment (not shown), any of the VCO's described may utilize BJT's rather than MOSFET's, with the collectors, bases, and emitters of the BJT's coupled as shown for the drains, gates, and sources, respectively, of the MOSFET's shown. Furthermore, unless otherwise noted, in this specification and in the claims, the terms "drain," "gate," and "source" may encompass both the conventional meanings of those terms associated with MOSFET's, as well as the corresponding nodes of other three-terminal transconductance devices, such as BJT's, which correspondence will be evident to one of ordinary skill in the art of circuit design.

Figure 8:
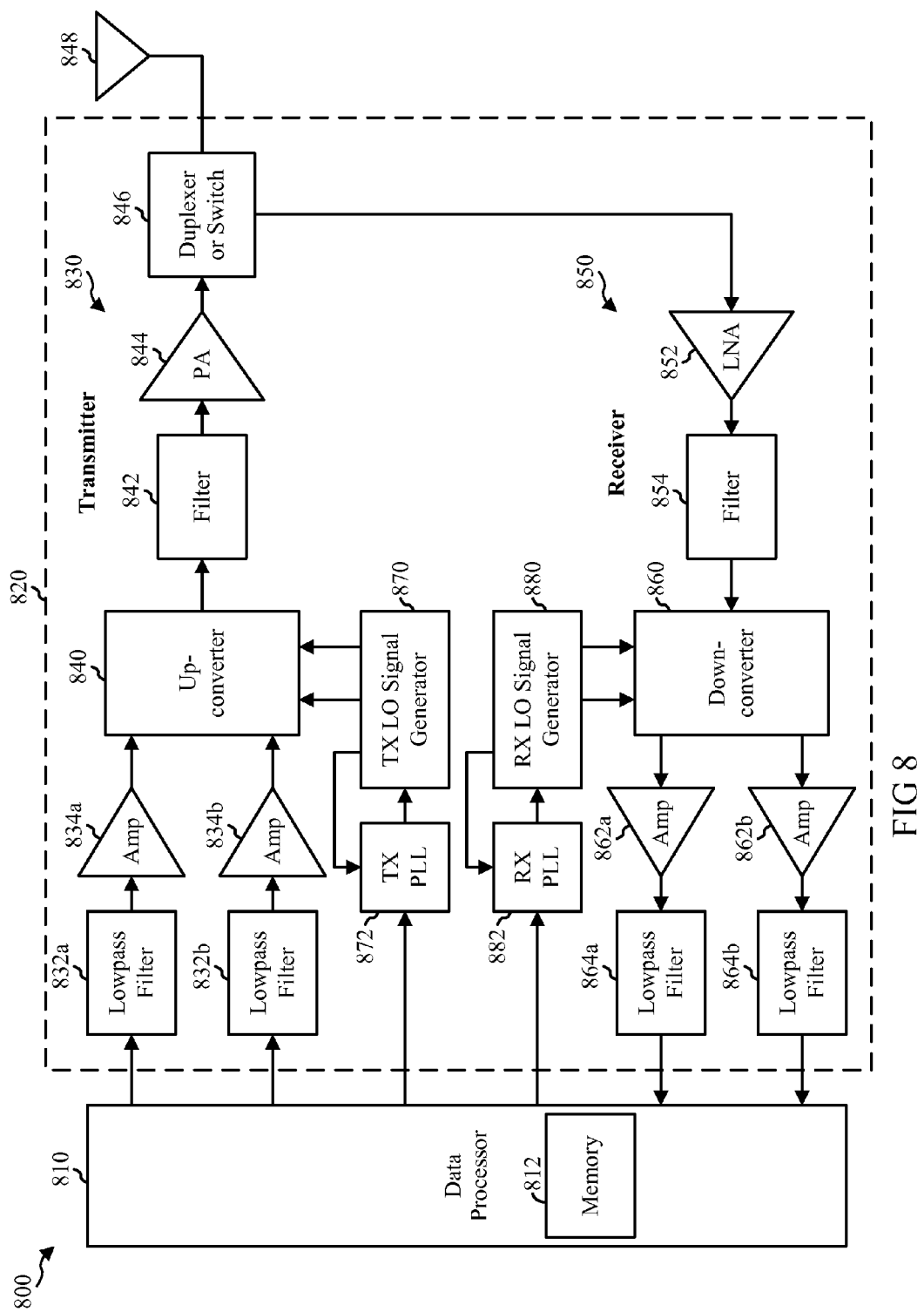
FIG. 8 illustrates a block diagram of a design of a wireless communication device in which the techniques of the present disclosure may be implemented.

FIG. 8 shows a block diagram of a design of a wireless communication device 800 in which the techniques of the present disclosure may be implemented. In the design shown in FIG. 8, wireless device 800 includes a transceiver 820 and a data processor 810 having a memory 812 to store data and program codes. Transceiver 820 includes a transmitter 830 and a receiver 850 that support bi-directional communication. In general, wireless device 800 may include any number of transmitters and any number of receivers for any number of communication systems and frequency bands.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 8, transmitter 830 and receiver 850 are implemented with the direct-conversion architecture.

In the transmit path, data processor 810 processes data to be transmitted and provides I and Q analog output signals to transmitter 830. Within transmitter 830, lowpass filters 832a and 832b filter the I and Q analog output signals, respectively, to remove undesired images caused by the prior digital-to-analog conversion. Amplifiers (Amp) 834a and 834b amplify the signals from lowpass filters 832a and 832b, respectively, and provide I and Q baseband signals. An upconverter 840 upconverts the I and Q baseband signals with I and Q transmit (TX) local oscillating (LO) signals from a TX LO signal generator 870 and provides an upconverted signal. A filter 842 filters the upconverted signal to remove undesired images caused by the frequency upconversion as well as noise in a receive frequency band. A power amplifier (PA) 844 amplifies the signal from filter 842 to obtain the desired output power level and provides a transmit RF signal. The transmit RF signal is routed through a duplexer or switch 846 and transmitted via an antenna 848.

In the receive path, antenna 848 receives signals transmitted by base stations and provides a received RF signal, which is routed through duplexer or switch 846 and provided to a low noise amplifier (LNA) 852. The received RF signal is amplified by LNA 852 and filtered by a filter 854 to obtain a desirable RF input signal. A downconverter 860 downconverts the RF input signal with I and Q receive (RX) LO signals from an RX LO signal generator 880 and provides I and Q baseband signals. The I and Q baseband signals are amplified by amplifiers 862a and 862b and further filtered by lowpass filters 864a and 864b to obtain I and Q analog input signals, which are provided to data processor 810.

TX LO signal generator 870 generates the I and Q TX LO signals used for frequency upconversion. RX LO signal generator 880 generates the I and Q RX LO signals used for frequency downconversion. Each LO signal is a periodic signal with a particular fundamental frequency. A PLL 872 receives timing information from data processor 810 and generates a control signal used to adjust the frequency and/or phase of the TX LO signals from LO signal generator 870. Similarly, a PLL 882 receives timing information from data processor 810 and generates a control signal used to adjust the frequency and/or phase of the RX LO signals from LO signal generator 880.

FIG. 8 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 8. Furthermore, other circuit blocks not shown in FIG. 8 may also be used to condition the signals in the transmitter and receiver. Some circuit blocks in FIG. 8 may also be omitted. All or a portion of transceiver 820 may be implemented on one or more analog integrated circuits (ICs), RF ICs (RFICs), mixed-signal ICs, etc.

LO signal generators 870 and 880 may each include a frequency divider that receives a clock signal and provides a divider output signal. The clock signal may be generated by a voltage-controlled oscillator (VCO) or some other types of oscillator. The clock signal may also be referred to as a VCO signal, an oscillator signal, etc. In any case, it may be desirable to obtain differential output signals from a frequency divider. The techniques of the present disclosure may be readily applied to the design of such a VCO in the wireless communication device 800.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. An apparatus for generating a signal having a controlled oscillation frequency at a pair of output nodes, the apparatus comprising:
a first transistor and a second transistor, wherein a first drain of the first transistor is coupled to a first node of the pair of output nodes and a second drain of the second transistor is coupled to a second node of the pair of output nodes;
an inductive-capacitance (LC) tank including a first inductor coupled in parallel with a first capacitor, wherein the LC tank is coupled to a first gate of the first transistor and to a second gate of the second transistor, and wherein the first inductor is configured to receive a biasing voltage;
a second inductor and a second capacitor having a selectable capacitance coupled to the pair of output nodes, the second capacitor being coupled to the first node of the pair of output nodes and coupled to the second node of the pair of output nodes, the second inductor being magnetically coupled to the first inductor with a coupling coefficient based on a semiconductor process technology;
a third transistor and a fourth transistor coupled to the pair of output nodes; and
a third inductor coupled to gates of the third transistor and the fourth transistor, the third inductor being magnetically coupled to the second inductor.

2. The apparatus of claim 1, wherein the first transistor and the second transistor are p-type metal oxide semiconductor (PMOS) transistors, and wherein the third transistor and the fourth transistor are n-type metal oxide semiconductor (NMOS) pair.

3. The apparatus of claim 1, wherein the first transistor and the second transistor are n-type metal oxide semiconductor (NMOS) transistors, and wherein the third transistor and the fourth transistor are p-type metal oxide semiconductor (PMOS) transistors.

4. The apparatus of claim 1, wherein the first inductor includes a first constituent inductor serially coupled to a second constituent inductor at a coupling point, wherein the biasing voltage is received at the coupling point.

5. The apparatus of claim 1, wherein the first capacitor includes a selectable bank of capacitors for coarse frequency tuning and wherein the second capacitor comprises an analog-voltage controlled varactor for fine frequency tuning.

6. A method for generating a signal having a controlled oscillation frequency at a pair of output nodes of an oscillator, the oscillator comprising: a first transistor and a second transistor, wherein a first drain of the first transistor is coupled to a first node of the pair of output nodes and a second drain of the second transistor is coupled to a second node of the pair of output nodes; an inductive-capacitance (LC) tank including a first inductor coupled in parallel with a first capacitor, wherein the LC tank is coupled to a first gate of the first transistor and to a second gate of the second transistor, and wherein a biasing voltage is received at the first inductor; a third transistor and a fourth transistor, wherein drains of the third transistor and the fourth transistor are coupled to the pair of output nodes, a second inductor coupled to the pair of output nodes; a third inductor coupled to gates of the third transistor and the fourth transistor; a second capacitor having a selectable capacitance coupled to the first node of the pair of output nodes and coupled to the second node of the pair of output nodes; the method comprising: magnetically coupling the second inductor to the first inductor with a coupling coefficient based on a semiconductor process technology; and magnetically coupling the third inductor to the second inductor.

7. A method comprising: receiving a biasing voltage at a first inductor of an oscillator that comprises a single parallel inductive-capacitance (LC) tank, wherein the single parallel LC tank is coupled to a first gate of a first transistor and to a second gate of a second transistor, wherein a first drain of the first transistor is coupled to a first node of a pair of output nodes of the oscillator and a second drain of the second transistor is coupled to a second node of the pair of output nodes of the oscillator; and magnetically coupling the first inductor to a second inductor, wherein the second inductor is coupled to the pair of output nodes of the oscillator and wherein the second inductor is magnetically coupled to a third inductor.

8. The method of claim 7, wherein the third inductor is coupled to a third gate of a third transistor and to a fourth gate of a fourth transistor.

9. The method of claim 8, wherein the first transistor and the second transistor are p-type metal oxide semiconductor (PMOS) transistors, and wherein the third transistor and the fourth transistor are n-type metal oxide semiconductor (NMOS) transistors.

10. An apparatus comprising: a first transistor and a second transistor, wherein a first drain of the first transistor is coupled to a first node of a pair of output nodes and a second drain of the second transistor is coupled to a second node of the pair of output nodes; an inductive-capacitance (LC) tank including a first inductor coupled in parallel with a switchable bank of capacitors, wherein the switchable bank of capacitors of the LC tank is coupled to a first gate of the first transistor and to a second gate of the second transistor, and wherein the first inductor is configured to receive a biasing voltage; a second inductor and an analog voltage-controlled varactor coupled to the pair of output nodes, the analog voltage-controlled varactor being coupled to the first node of the pair of output nodes and coupled to the second node of the pair of output nodes, the second inductor being magnetically coupled to the first inductor; a third transistor and a fourth transistor, wherein a third drain of the third transistor is coupled to the first node of the pair of output nodes and a fourth drain of the fourth transistor is coupled to the second node of the pair of output nodes; and a third inductor coupled to a third gate of the third transistor and to a fourth gate of the fourth transistor, wherein the third inductor is magnetically coupled to the second inductor; wherein a signal having a controlled oscillation frequency is generated at the pair of output nodes at least partially based on coarse tuning using the switchable bank of capacitors and at least partially based on fine tuning using the analog voltage-controlled varactor.

11. The apparatus of claim 10, wherein the first transistor and the second transistor are p-type metal oxide semiconductor (PMOS) transistors, and wherein the third transistor and the fourth transistor are n-type metal oxide semiconductor (NMOS) transistors.

12. The apparatus of claim 10, wherein the first transistor and the second transistor are n-type metal oxide semiconductor (NMOS) transistors, and wherein the third transistor and the fourth transistor are p-type metal oxide semiconductor (PMOS) transistors.

* * * * *